United States Patent [19]
Wauk, II

[11] 4,016,515
[45] Apr. 5, 1977

[54] BULK ACOUSTIC WAVE DELAY LINE
[75] Inventor: Michael T. Wauk, II, Agoura, Calif.
[73] Assignee: Hughes Aircraft Company, Culver City, Calif.
[22] Filed: Dec. 31, 1975
[21] Appl. No.: 645,492
[52] U.S. Cl. .............................. 333/30 R; 310/9.5; 310/9.7
[51] Int. Cl.² ..................... H03H 9/04; H03H 9/30; H01L 41/10; H04R 23/00
[58] Field of Search ..................... 333/29, 30 R, 72; 310/8, 8.1, 9.7, 9.8, 9.5; 350/161

[56] References Cited
UNITED STATES PATENTS 3,343,105   9/1967   Van Der Pauw ................ 333/30 R
3,593,214   7/1971   Cooper ............................ 333/30 R
3,609,009   9/1971   Lohman et al. .................... 350/161

Primary Examiner—Alfred E. Smith
Assistant Examiner—Marvin Nussbaum
Attorney, Agent, or Firm—John Holtrichter, Jr.; W. H. MacAllister

[57] ABSTRACT

A bulk wave acoustic wave device with electrodes fabricated on a crystal in the form of arrays each having a plurality of closely spaced electrodes, one array being angularly disposed with respect to the other to provide at least one pair of matching electrodes notwithstanding uncontrolled beam wander within the crystal.

9 Claims, 9 Drawing Figures

BULK ACOUSTIC WAVE DELAY LINE

BACKGROUND OF THE INVENTION

The background of the invention will be set forth in two parts.

1. Field of the Invention

This invention relates to delay lines and more particularly to bulk acoustic wave delay lines.

2. Description of the Prior Art

The usefulness of propagating elastic wave energy in solids has been known for many years and is generally known as microwave acoustic technology. Utilizing this technology, such devices which store and delay signals have been developed to a relatively high degree. Many texts are presently available which thoroughly describe the history and advancements of this art, such as, for example, "Ultrasonic Methods I Solid State Physics" by Rohn Truell, Charles Elbaum and Bruce B. Chick, Academic Press, 1969.

Probably of greatest interest in the field of bulk wave devices has been bulk wave delay lines. A bulk acoustic wave delay line typically consists of thin film piezoelectric transducers deposited on the parallel faces of a crystal, such as quartz for example, which is capable of supporting propagating bulk acoustic wave energy. The effective size of the transducer is determined by the metal top electrode, which, in consideration of capacitance and diffraction loss, is generally chosen to be 0.002 to 0.040 inch in diameter. The reception of the beam at the receiving end requires registration of the receiving transducer metal top electrode to a fraction of this diameter. Of importance is the fact that the location of the beam at the output or receiving end depends not only on the input transducer location, but also on the crystallographic orientation and end face angles. Thus, it has been a significant problem to achieve adequate electrode location in a bulk wave device. For beam diameters of 0.002 inch, it has been virtually impossible.

In the past, such techniques as very high tolerance X-ray crystal orientation, crystal flat orientation, and lithography registration tooling have been proposed and attempted in order to overcome this problem. Another prior art technique has been to fabricate a single transducer on one end of a crystal, and then attempt to find the acoustic beam at the other end using acoustooptic Bragg scattering techniques, followed by the disposing of a transducer or multiplicity of transducers in the approximate required location.

SUMMARY OF THE INVENTION

In view of the foregoing factors and conditions characteristic of the prior art, it is a primary object of the present invention to provide an improved bulk acoustic wave delay line.

Another object of the present invention is to provide a relatively simple and economical-to-construct bulk acoustic wave delay line.

Still another object of the present invention is to provide a bulk acoustic wave delay line having input and output transducers that always have at least one pair of array top electrodes that exactly match each other, thus assuring interception of the full acoustic beam by the receiving transducer.

In accordance with an embodiment of the present invention, a bulk acoustic wave delay line includes a body of material capable of supporting propagating acoustic wave energy therein, and transducer means, with input and output transducers disposed on the body in spaced relationship to each other for respectively converting electromagnetic wave energy to acoustic wave energy and the converse thereof, and for directing and receiving the propagating acoustic wave energy. The transducers each include a plurality of relatively closely spaced, symmetrically disposed and evenly dispersed conductive electrodes defining respectively first and second top-electrodearray patterns. The second pattern is oriented at a predetermined offset angle with respect to the first pattern so as to cause propagating acoustic wave energy from at least one of the electrodes in the first pattern to be intercepted by at least one of the electrodes in the second pattern.

According to different embodiments of the invention, electrodes may be circular or rectangular and the array patterns may be polygonal, such as hexagonal, for example, or rectangular.

The features of the present invention which are believed to be novel are set forth with particularity in the appended claims. The present invention, both as to its organization and manner of operation, together with further objects and advantages thereof, may best be understood by making reference to the following description taken in conjunction with the accompanying drawings in which like reference characters refer to like elements in the several views.

Figure 1:
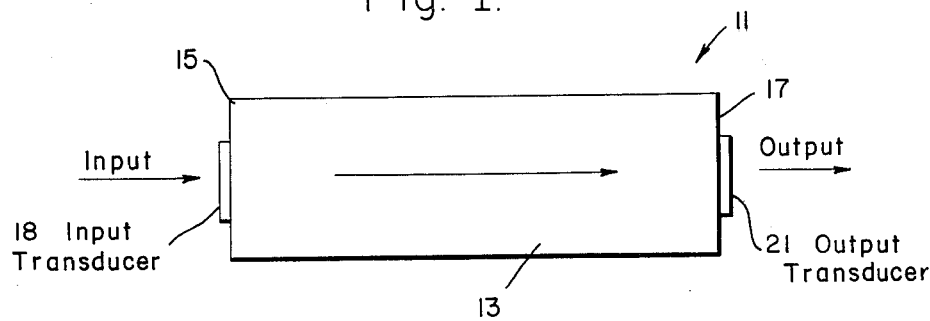
FIG. 1 is a schematic illustration of a bulk acoustic wave delay line in accordance with one embodiment of the present invention.

DESCRIPTION OF THE PREFERRED EMBODIMENT:

Referring now to the drawings and more particularly to FIG. 1, there is shown a bulk acoustic wave delay line 11 including a body of material 13 having opposite ends 15 and 17 on which are respectively disposed an input transducer 19 and an output transducer 21. The body 13 may be of any suitable material such as quartz, for example, that is capable of supporting acoustic wave energy therethrough, between the ends 15 and 17.

Figure 2:
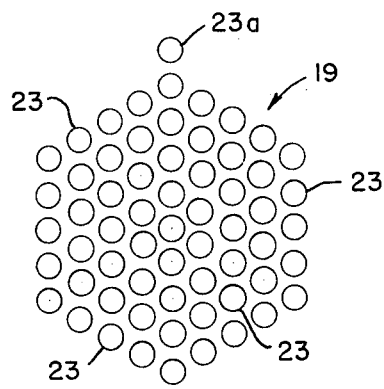
FIG. 2 is a plan view of a transducer hexagonal electrode array pattern usable at one end of the delay line of FIG. 1.

The input transducer 19 is illustrated in the enlarged plan view of FIG. 2. The transducer comprises a plurality of relatively closely spaced, symmetrically disposed and evenly dispersed conductive electrodes 23. The transducer is a thin film structure wherein each of the circular electrodes 23 acts as a piezoelectric transducing element. In consideration of capacitance and diffraction loss, the electrodes 23 are generally chosen in the range of approximately 0.002 to 0.040 inches in diameter. The reception of an acoustic wave beam generated by any one of the electrodes 23 at the receiving end or output transducer requires registration to a fraction of this diameter. The location of the beam at the output transducer 21 depends not only on the input transducer location, but also on the crystallographic orientation and end face angles. As mentioned previously, this has been a severe problem in the prior art and virtually impossible for beam diameters of about 0.002 inch or less.

Figure 3:
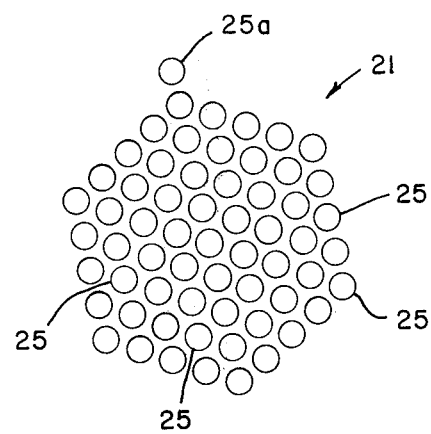
FIG. 3 is a plan view of a transducer hexagonal electrode array pattern usable at the opposite end of the delay line of FIG. 1.

The present invention provides for the use of an electrode array as the output transducer 21 similar to that of the input transducer 19, and is illustrated in enlarged form in FIG. 3. Although the arrays are shown to be hexagonal, it should be understood that arrays having other shapes, such as square, or other polygonal configuration, for example, may be used. If a beam is generated at one of the electrodes 23 by, for example, attaching a gold wire by any conventional means such as a thermal compression gold wire bond, then the beam will impinge the output transducer electrode array at some location. Since the array dots cannot be made arbitrarily close together due to the bonding used in the connection, and where the output electrode array is not properly oriented, as will be explained later, the beam propagating from the input transducer very likely will not exactly match any one particular electrode 25 of the output transducer 21, and may in fact be centered in the space between these electrodes. This would result in an additional insertion loss of approximately 5 to 10 dB.

In accordance with an important aspect of the present invention provided to overcome the problem of non-registration, the input and output arrays are oriented at some suitable relative angle. This angle is not very critical and is approximately given by the relation $$\tan\theta = \frac{2}{3} \frac{\text{electrode-to-center spacing}}{\text{electrode array center-to-edge distance}}.$$

The result is that under any conditions of beam wander within the radius of the overall transducer array, there will always be at least one pair of electrodes (input to output) that exactly match.

There is a simple procedure for converging on the best pair of electrodes by testing the response of a few such pairs of electrodes. This is accomplished with the aid of a dual coaxial probe system that allows generation and reception at any electrode by touching it with a probe. In the embodiment illustrated in FIGS. 2 and 3, there is provided the additional advantage of having the optimum pair of electrodes surrounded by six pairs of electrodes that are within a few dB of optimum. This is helpful in case of transducer shorts or ball bond failure, for example.

Figure 4:
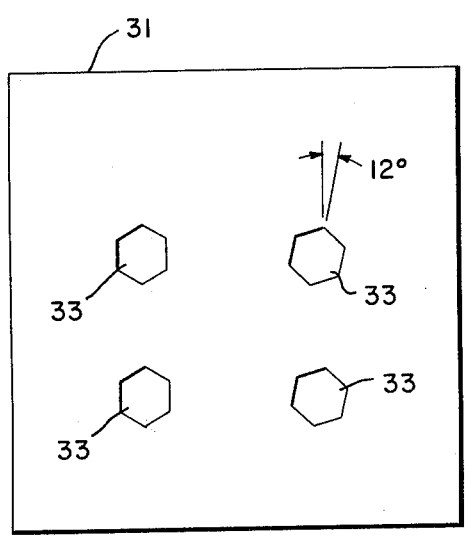
FIG. 4 is a plan view of a photo mask used in fabricating the array patterns of FIGS. 2 and 3.
Figure 5:
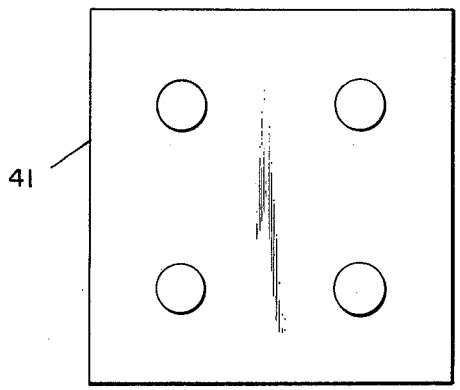
FIG. 5 is a front elevational view of a bulk wave delay line crystal holder used in the fabrication of array patterns with 12° offset angles.
Figure 6:
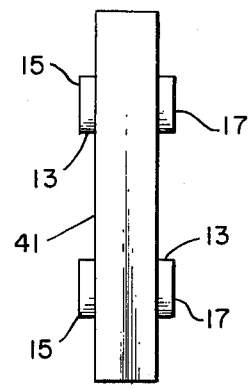
FIG. 6 is a side elevational view of the holder of FIG. 5.

The fabrication of the patterns of FIGS. 2 and 3 has been found to be relatively simple. A photolithography mask 31 shown in FIG. 4 has been used with much success. The mask 31 contains four hexagonal arrays 33. The left-hand two are oriented straight up, while the right-hand two are tilted 12°. Crystals 13 are mounted in a holder 41 shown in FIG. 5, four at a time, which holder allows access to both ends 15 and 17 or the crystals. Exposure is made to one end, the holder is then flipped over, and exposure is made to the other end. This produces patterns with the 12° relative rotation on each of the four crystals. The uppermost electrodes 23a and 25a in FIGS. 2 and 3 are not necessary and are provided for purposes of aiding in recognizing the indexing of the input and output array patterns.

From the foregoing, it should be evident that there has herein been described a new and useful bulk acoustic wave delay line that avoids very high tolerance X-ray crystal orientation, crystal flat orientation, and lithography registration tooling, heretofore normally required. Also, the invention avoids the complexity of acousto-optic Bragg scattering of light to determine acoustic beam location.

Figure 8:
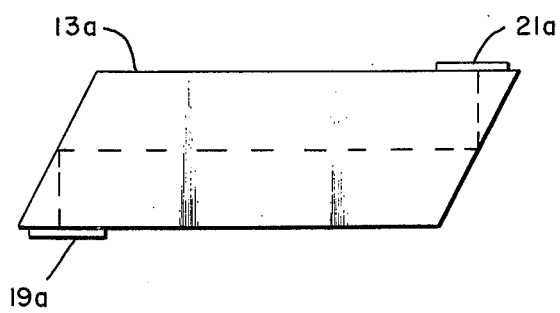
FIG. 8 is a schematic plan view of another embodiment of the present invention.
Figure 9:
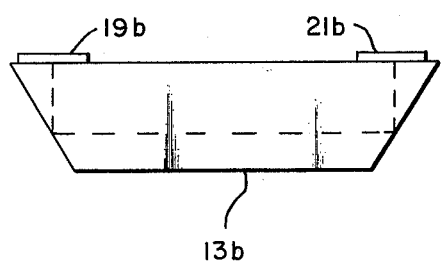
FIG. 9 is a schematic plan view of yet another embodiment of the present invention.
Figure 7:
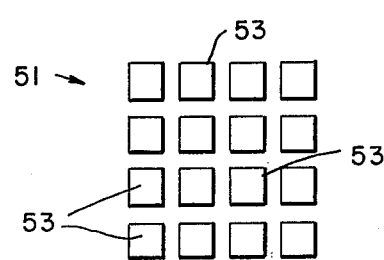
FIG. 7 is a rectangular element array pattern.

It should be understood that although certain materials and configurations have been specified and described in detail, other materials and configurations exhibiting similar characteristics and functions may be utilized within the contemplation of the invention. For example, a square or rectangular electrode pattern 51 having square or rectangular shaped electrodes 53 shown in FIG. 7 may be substituted for the hexagonal/round pattern and electrode shapes of FIGS. 2 and 3. Further, the shape of the crystal and placement of the transducers need not be as shown in the embodiment of FIG. 1. Exemplary illustrations in schematic form are shown in FIGS. 8 and 9 for other embodiments of the invention, the operations of which are similar to the previously described embodiment.

What is claimed is:

1. A bulk acoustic wave delay line, comprising:
   a body of material capable of supporting propagating acoustic wave energy in said body;
   transducer means including input and output transducers disposed on said body in spaced relationship to each other for respectively converting electromagnetic wave energy to acoustic wave energy and the converse thereof, and for directing and receiving said propagating acoustic wave energy, said transducers each including a plurality of relatively closely spaced, symmetrically disposed and evenly dispersed conductive electrodes defining respectively first and second top-electrode array patterns, each of said array patterns defining an axis of symmetry, said second pattern being oriented to have its axis of symmetry at a predetermined offset angle with respect to said axis of symmetry of said first pattern causing propagating acoustic wave energy from at least one of said electrodes in said first pattern to be intercepted by at least one of said electrodes in said second pattern.

2. The bulk acoustic wave delay line according to claim 1, wherein said input and output transducers are disposed at opposite parallel ends of said body.

3. The bulk acoustic wave delay line according to claim 1, wherein said electrodes are circular.

4. The bulk acoustic wave delay line according to claim 3, wherein said pattern is polygonal.

5. The bulk acoustic wave delay line according to claim 4, wherein said pattern is hexagonal.

6. The bulk acoustic wave delay line according to claim 1, wherein said electrodes are rectangular and wherein said pattern is rectangular.

7. The bulk acoustic wave delay line according to claim 1, wherein said offset angle, $\theta$, is determined by the relationship $$\tan\theta = \tfrac{2}{3} \frac{\text{electrode center-to-center spacing}}{\text{electrode array center-to-edge distance}}.$$

8. The bulk acoustic wave delay line according to claim 1, wherein said array patterns are hexagonal, said electrodes are circular and said offset angle is approximately 12°.

9. The bulk acoustic wave delay line according to claim 1, wherein said electrodes are circular and have a diameter between approximately 4 to 8 mil.

* * * * *